United States Patent
Li et al.

(10) Patent No.: US 7,916,821 B2
(45) Date of Patent: Mar. 29, 2011

(54) METHOD AND APPARATUS FOR OUTPUT DATA SYNCHRONIZATION WITH SYSTEM CLOCK IN DDR

(75) Inventors: Wen Li, Boise, ID (US); Aaron M. Schoenfeld, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 826 days.

(21) Appl. No.: 11/247,496

(22) Filed: Oct. 10, 2005

(65) Prior Publication Data

US 2006/0029173 A1 Feb. 9, 2006

Related U.S. Application Data

(63) Continuation of application No. 09/585,864, filed on Jun. 1, 2000, now Pat. No. 6,968,026.

(51) Int. Cl.
*H04L 7/00* (2006.01)

(52) U.S. Cl. ........................................ 375/373; 327/156

(58) Field of Classification Search .................. 375/354, 375/371, 373–376; 327/100, 141, 155, 156, 327/158, 161
See application file for complete search history.

(56) References Cited

U.S. PATENT DOCUMENTS

| | | | |
|---|---|---|---|
| 5,223,755 A | 6/1993 | Richley | |
| 5,459,422 A * | 10/1995 | Behrin | 327/276 |
| 5,604,775 A | 2/1997 | Saitoh et al. | |
| 5,811,998 A | 9/1998 | Lundberg et al. | |
| 5,969,552 A | 10/1999 | Lee et al. | |
| 6,028,898 A * | 2/2000 | Sparks et al. | 375/317 |
| 6,178,212 B1 * | 1/2001 | Akashi | 375/355 |
| 6,323,705 B1 * | 11/2001 | Shieh et al. | 327/158 |
| 8,377,093 | 4/2002 | Lee et al. | |
| 6,625,242 B1 | 9/2003 | Yoo et al. | |
| 6,704,881 B1 | 3/2004 | Li et al. | |
| 2001/0049812 A1 * | 12/2001 | Lutkemeyer | 716/6 |
| 2003/0039328 A1 * | 2/2003 | Tomofuji et al. | 375/354 |

* cited by examiner

*Primary Examiner* — Kevin M Burd
(74) *Attorney, Agent, or Firm* — Lerner, David, Littenberg, Krumholz & Mentlik, LLP

(57) ABSTRACT

A method and apparatus are provided for substantially reducing or eliminating the timing skew caused by delay elements in a delay locked loop. A method and apparatus are disclosed wherein a rising edge of a local timing signal is established and phase-locked to a rising edge of a system clock signal by delaying the system clock signal. A falling edge of the local timing signal is established and phase-locked to a falling edge of the system clock signal by further delaying only a portion of a signal representative of the delayed clock signal. By separately delaying different portions of the system clock signal and using the separately delayed portions to establish a local timing signal, a local timing signal may be established which is compensated for the varied effects of delay elements in a delay locked loop.

9 Claims, 5 Drawing Sheets

METHOD AND APPARATUS FOR OUTPUT DATA SYNCHRONIZATION WITH SYSTEM CLOCK IN DDR

CROSS-REFERENCE TO RELATED APPLICATION

This application is a continuation of application Ser. No. 09/585,864, filed Jun. 1, 2000, now U.S. Pat. No. 6,968,026, issued Nov. 22, 2005.

BACKGROUND OF THE INVENTION

1. Field of the Invention

The present invention relates generally to synchronizing the timing of data transfer with a system clock using a delay lock loop. More particularly, the present invention relates to phase-locking to both the rising and the falling edges of the system clock by adding to or subtracting additional compensating delays from the falling edge of an internal clock.

2. State of the Art

Modern high-speed integrated circuit devices, such as synchronous dynamic random access memories (SDRAM), microprocessors, etc., rely upon clock signals to control the flow of commands, data, addresses, etc., into, through, and out of the devices. Additionally, new types of circuit architectures such as RAMBUS and synchronous link dynamic random access memory (SLDRAM) require individual parts to work in unison even though such parts may individually operate at different speeds. As a result, the ability to control the operation of a part through the generation of local clock signals has become increasingly more important. Conventionally, data transfer operations are initiated at the edges of the clock signals (i.e., transitions from high to low or low to high).

In synchronous systems, integrated circuits are synchronized to a common system reference clock. This synchronization often cannot be achieved simply by distributing a single system clock to each of the integrated circuits for the following reason, among others. When an integrated circuit receives a system clock, the circuit often must condition the system clock before the circuit can use the clock. For example, the circuit may buffer the incoming system clock or may convert the incoming system clock from one voltage level to another. This processing introduces its own delay, with the result that the locally processed system clock often will no longer be adequately synchronized with the incoming system clock. The trend toward faster system clock speeds further aggravates this problem since faster clock speeds reduce the amount of delay, or clock skew, which can be tolerated.

To remedy this problem, an additional circuit is conventionally used to synchronize the local clock to the system clock. Two common circuits which are used for this purpose are the phase-locked loop (PLL) and the delay-locked loop (DLL). In the phase-locked loop, a voltage-controlled oscillator produces the local clock. The phases of the local clock and the system clock are compared by a phase-frequency detector, with the resulting error signal used to drive the voltage-controlled oscillator via a loop filter. The feedback via the loop filter phase locks the local clock to the system clock. The delay-locked loop generates a synchronized local clock by delaying the incoming system clock by an integer number of periods. More specifically, the buffers, voltage level converters, etc., of the integrated circuit introduce a certain amount of delay. The delay-locked loop introduces an additional amount of delay such that the resulting local clock is synchronous with the incoming system clock.

In double data rate (DDR) dynamic random access memory (DRAM), wherein operations are initiated on both the rising and the falling edges of the clock signals, it is known to employ a delay lock loop (DDL) to synchronize the output data with the system clock (XCLK) using a phase detector. In an ideal case, the rising edge data is perfectly aligned with the rising edge of the XCLK, the falling edge data is perfectly aligned with the falling edge of the XCLK, and the tAC, or time from when a transition occurs on the XCLK to the time when the data comes through the synchronizing data output (DQ), is within specifications. To approximate an ideal system, a phase detector is conventionally used to lock the rising edge of the DQ signal to the rising edge of the XCLK. In the ideal system, as a result of the rising edge of the DQ signal being phase-locked to the rising edge of the XCLK, the falling edge of the DQ signal changes phase at the same time as the XCLK, or at least within an allowed tolerance (tAC).

FIG. 1 depicts a DDR DRAM data synchronizing circuit using a DLL as is presently contemplated in the art. At system initialization, a phase detector 2 is activated by an initialization signal 4. The phase detector 2 compares the phase of a signal on the CLKIN signal line 6, a derivative of the signal on the XCLK signal line 8, with a signal on the OUT_MDL signal line 10, a model of the data output timing signal. The phase detector 2 then adjusts the DLL delay elements 12 using right shift and left shift signals, on respective ShiftR 14 and ShiftL 16 signal lines, to respectively decrease or increase the time delay added to the CLKIN signal 7 (FIG. 2) on the CLKIN signal line 6 with respect to the OUT_MDL signal 11 (FIG. 2) on the OUT_MDL signal line 10. By adjusting the delay of the signal on the CLKIN signal line 6 through the DLL delay elements 12, the phase detector 2 can align the rising edge of the signal on the XCLK signal line 8 with the rising edge of the signal on the DQ signal line 24.

FIG. 2 is a timing diagram for the synchronizing circuitry of FIG. 1. As shown in FIG. 2, the rising edge 26 of the XCLK signal 9, which is carried on the XCLK signal line 8 of FIG. 1, is aligned with the rising edge 28 of the DQ signal 25, which is carried on the DQ signal line 24 of FIG. 1. As is indicated by the arrows shown in FIG. 2, the rising edge 30 of DLLCLK signal 33 (carried on the DLLCLK signal line 32 of FIG. 1) initiates the rise and fall of the DLLR signal 21 (carried on the DLLR signal line 20 of FIG. 1), through the Rise Fall CLK Generator 18 (FIG. 1), which in turn initiates the rising edge 28 of the DQ signal 25. Likewise, the rising edge 34 of the /DLLCLK signal 37 (carried on the /DLLCLK signal line 36) initiates the rise and fall of the DLLF signal 23 (carried on the DLLF signal line 22 of FIG. 1), which in turn initiates the falling edge 42 of the DQ signal 25. For proper data synchronization, the timing difference 46 between the falling edge 44 of the XCLK signal 9 and the falling edge 42 of the DQ signal 25 must be less than the tAC specifications for the system in which the synchronizing circuitry will be used. For the example shown in FIG. 2, the data is firing in a high-low, high-low pattern.

Unfortunately, however, not all synchronizing circuitry components are "ideal." Variations in layout, fabrication processes, operating temperatures, and the like, result in non-symmetrical delays among the DLL delay elements 12 (i.e., a high to low delay (tPHL) is not equal to a low to high delay (tPLH)). Because tPHL conventionally does not equal tPLH, this also results in a skewed data eye and a larger difference 46 between the falling edge 44 of the XCLK signal 9 and the falling edge 42 of the DQ signal 25. In other words, as shown in FIG. 2, for an XCLK signal 9 having a 55/45 duty cycle, due to inconsistencies in the DLL delay elements 12 (FIG. 1), the DLLCLK 33 and /DLLCLK 37 signals may have a duty cycle of 40/60. Because it is the rising edge 30 of the DLLCLK signal 33 and the rising edge 34 of the /DLLCLK signal 37 from which the rising 28 and falling 42 edges of the DQ signal 25 result, the non-symmetrical delays may result in a non-functional system. Furthermore, because the number of DLL delay elements used is cycle time dependent, the skew and difference 46 are also cycle time dependent. This unpredictable skew is undesirable for reliable high-speed performance.

It is, therefore, desirable to have synchronizing circuitry including a DLL which compensates for, or at least makes predictable, the variations in delay among the DLL delay elements to enable better matching between the XCLK signal and the DQ signal and thus more reliable performance at high speeds.

SUMMARY OF THE INVENTION

The present invention provides a method and apparatus to compensate for DLL skew. A first phase detector, an array of DLL delay elements and accompanying circuitry are disclosed to phase-lock the rising edge of a local data timing signal such as the DQ signal with the rising edge of the system clock XCLK signal. Additionally, a second phase detector, an array of DLL delay elements and accompanying circuitry are disclosed to phase-lock the falling edge of the DQ signal with the falling edge of the XCLK signal. Phase-locking both the rising and falling edges of the signals compensates for variances in the delay caused by the delay elements.

A method is disclosed wherein a system clock is received, processed and compared with a signal representative of an output data timing signal to adjust a setting of a delay circuit to phase-lock a first edge of the system clock to a first edge of the data output timing clock signal. The delayed clock signal is then received, processed and compared with a second signal representative of an output data timing signal to adjust a setting of a delay circuit to phase-lock a second edge of the system clock to a second edge of the data output timing signal. A phase-lock is accomplished when differences between the phases of the compared signals are substantially zero, or at least within an allowed tolerance.

An electronic system is disclosed comprising a processor, a memory device, an input, an output and a storage device, at least one of which includes a printed circuit board or other substrate having data synchronizing circuitry according to the present invention. A semiconductor substrate is also disclosed having data synchronizing circuitry according to the present invention.

BRIEF DESCRIPTION OF THE SEVERAL VIEWS OF THE DRAWING

The nature of the present invention, as well as other embodiments of the present invention, may be more clearly understood by reference to the following detailed description of the invention, to the appended claims, and to several drawings herein, wherein:

DETAILED DESCRIPTION OF THE INVENTION

Figure 1:
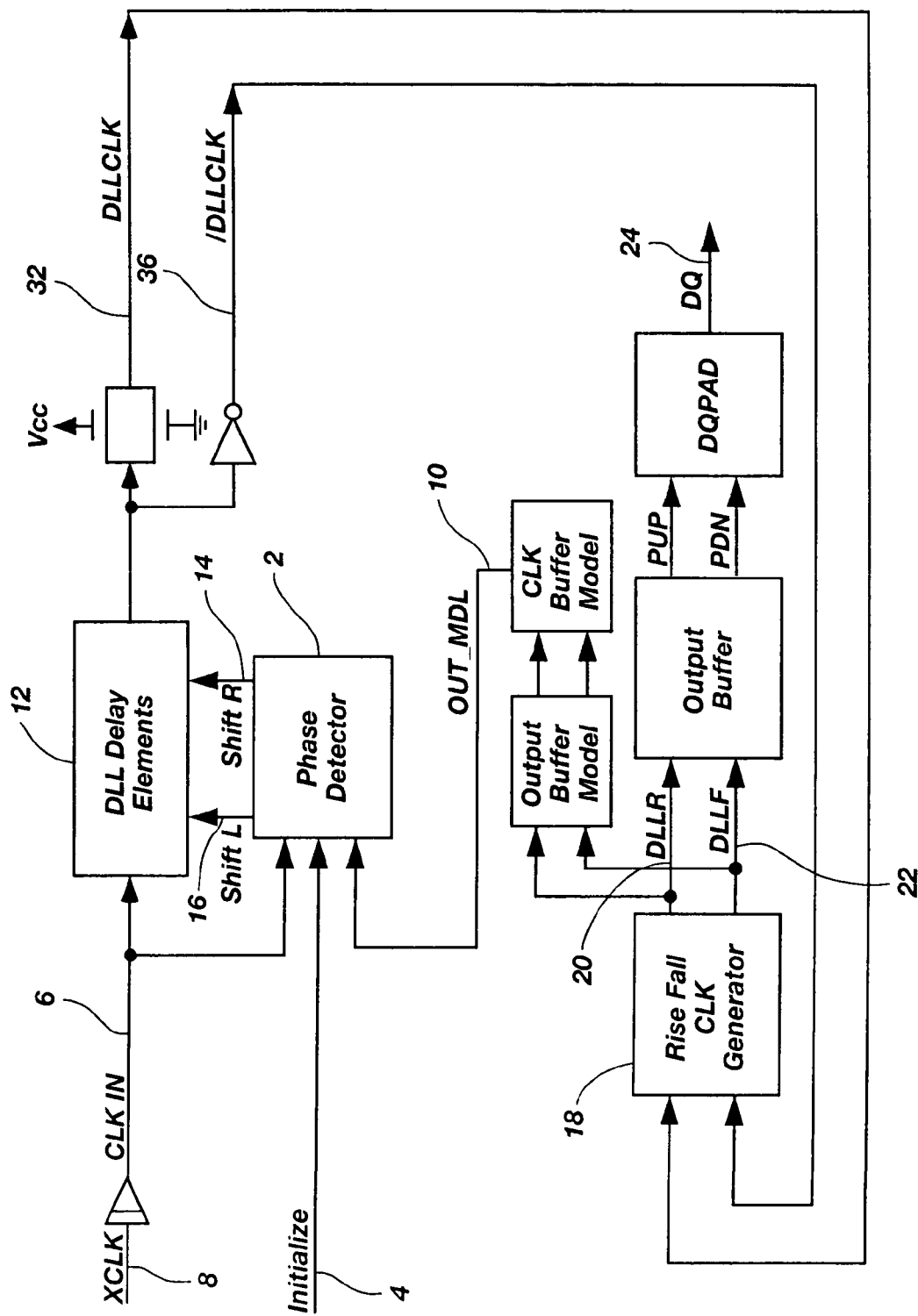
FIG. 1 is a block diagram of a prior art data synchronizing circuit.
Figure 2:
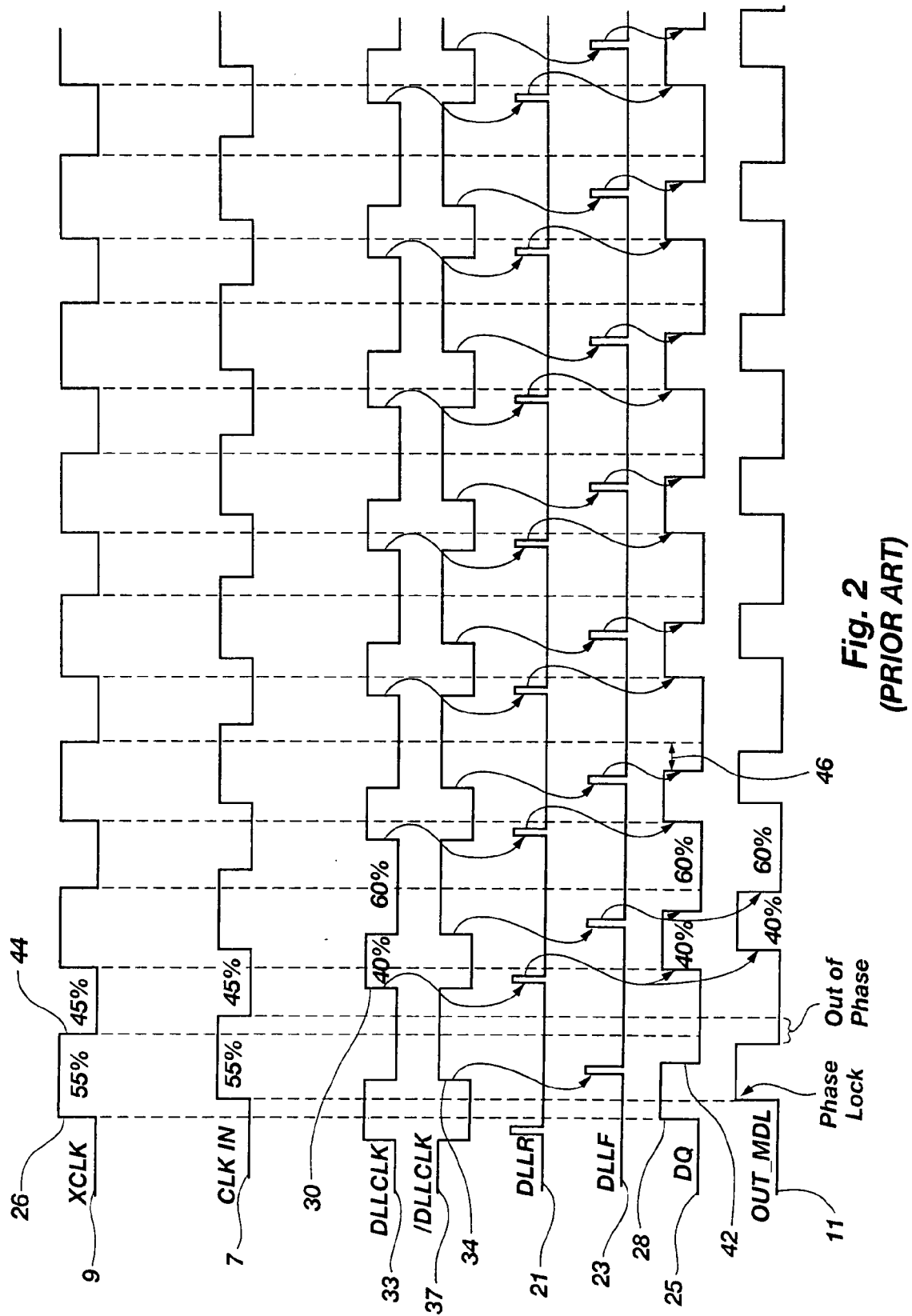
FIG. 2 is a timing diagram of the signals found in the prior art data synchronizing circuitry of FIG. 1.
Figure 3:
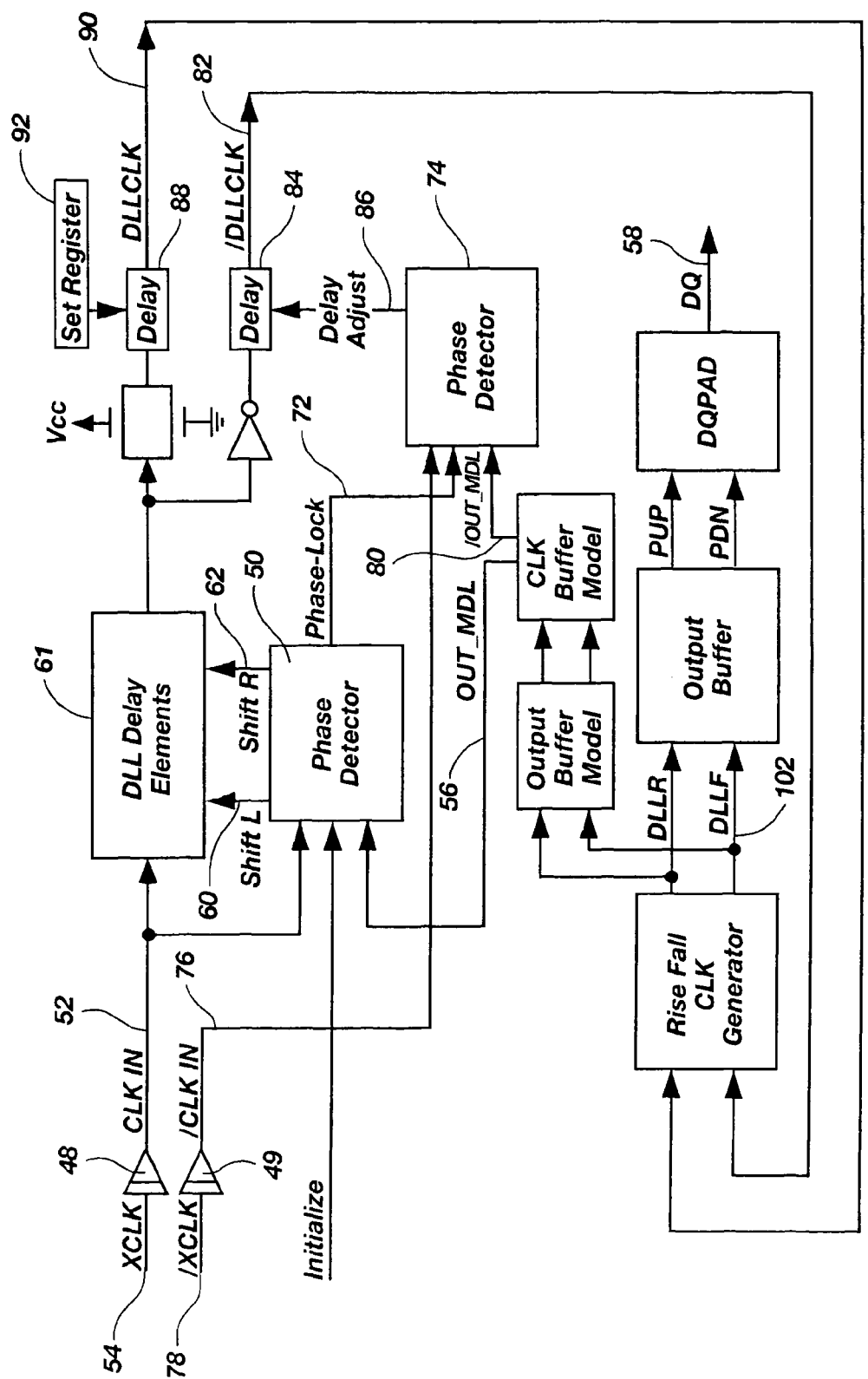
FIG. 3 is a block diagram of data synchronizing circuitry according to an embodiment of the present invention.
Figure 4:
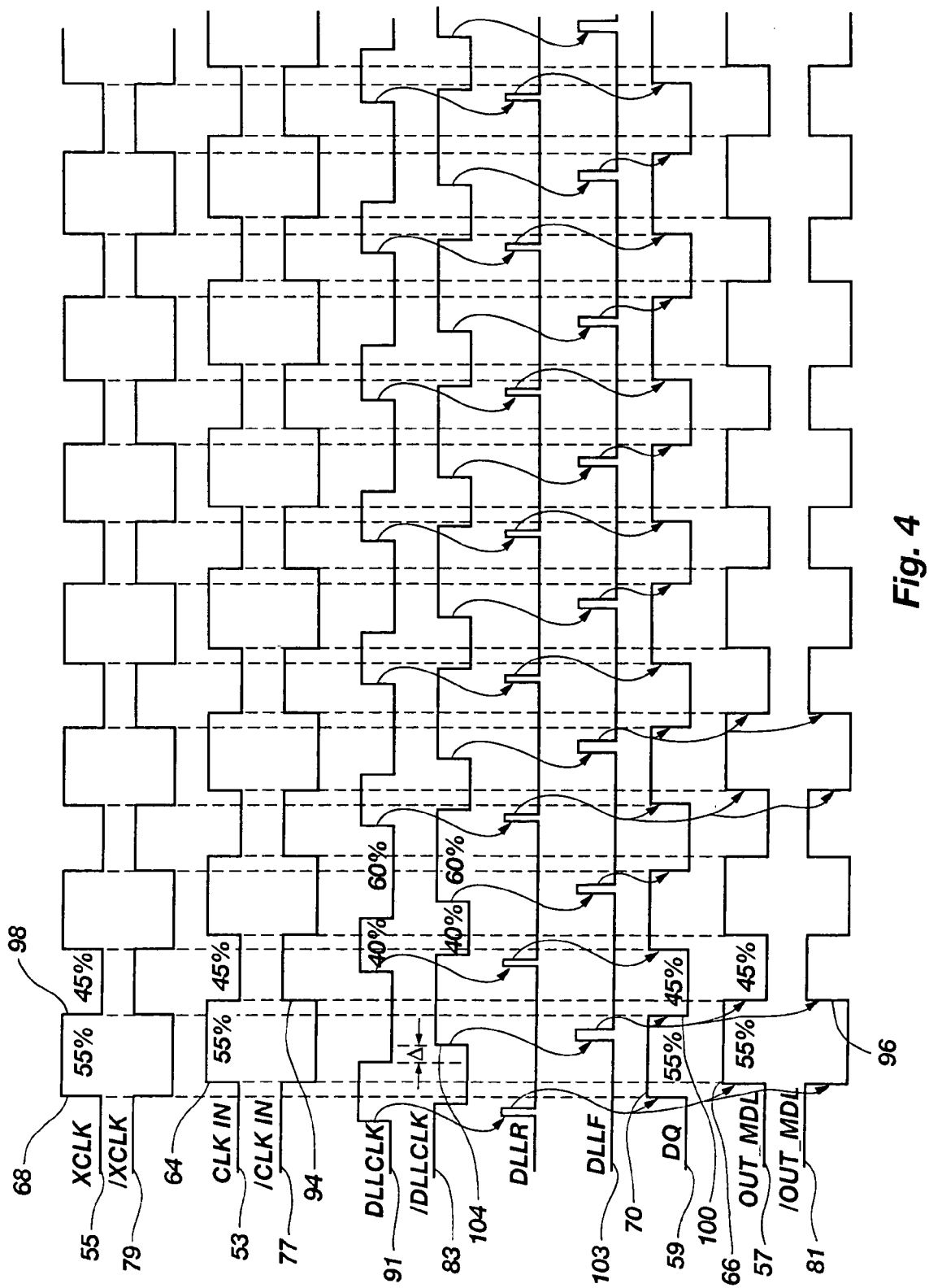
FIG. 4 is a timing diagram of the signals found in the data synchronizing circuitry of FIG. 3.

FIG. 3 is a block diagram of an embodiment of a data synchronizing circuit according to the present invention. The embodiment in FIG. 3 includes a first phase detector 50, like the phase detectors known in prior art synchronizing circuitry, which detects the relative phases of the signal on the CLKIN signal line 52, a derivative of the signal on the system clock XCLK signal line 54, and the signal on the OUT_MDL signal line 56, which models the timing of the signal on the data output DQ signal line 58. In response to a timing difference between the relative phases of the signals on the CLKIN signal line 52 and the OUT_MDL signal line 56, the first phase detector 50 adjusts the delay to the signal on the CLKIN signal line 52 by sending shift left and shift right signals through respective ShiftL 60 and ShiftR 62 signal lines to the DLL delay elements 61 to phase-lock the respective rising edges 64 and 66 (FIG. 4) of the CLKIN 53 and OUT_MDL 57 signals (FIG. 4). Phase-locking the rising edges 64 and 66 (FIG. 4) of the CLKIN 53 and OUT_MDL 57 signals, respectively, causes the rising edges 68 and 70 (FIG. 4) of the XCLK 55 and DQ 59 signals (FIG. 4) to align.

Once the first phase detector 50 has achieved a phase-lock, it outputs a phase-lock signal through a phase-lock signal line 72 to initiate a second phase detector 74. The second phase detector 74 compares the relative phases of the signals on the /CLKIN signal line 76, which is a derivative of the signal on the /XCLK signal line 78, and the /OUT_MDL signal line 80, which models the inverse of the timing of the data output DQ signal 59 on the DQ signal line 58. The CLKIN signal 53 and the XCLK signal 55 are related by a clock buffer 48. Similarly, the /CLKIN signal 77 and the /XCLK signal 79 are related by a clock buffer 49. In response to timing differences between the relative phases of the signals on the /CLKIN signal line 76 and the /OUT_MDL signal line 80, the second phase detector 74 adjusts the delay to the /DLLCLK signal line 82, caused by a delay circuit 84 and within a predetermined range of variance, by sending a delay adjust control signal on a delay adjust signal line 86. Another delay circuit 88 delays the DLLCLK signal 91 on the DLLCK signal line 90 by a fixed amount selected by a set register circuit 92. Preferably, the set register circuit 92 sets the delay circuit 88 for the DLLCLK signal 91 on the DLLCLK signal line 90 in the middle of the delay range (e.g., set=½ n where n is the integer number of delay elements). By placing the delay set in the middle of the delay range, the range of available positive and negative delays for the delay circuit 84 on the /DLLCLK signal line 82 is maximized. Alternatively, a third variable delay circuit could be used in place of delay circuit 88 to further fine-tune the rising edge of the system clock signal, though this is not preferred. Delaying the signal on the /DLLCLK signal line 82 by a variable amount controlled by the second phase detector 74 enables alignment of the rising edge 94 of the /CLKIN signal 77 with the rising edge 96 of the /OUT_MDL signal 81 (FIG. 4). Alignment of the respective rising edges 94 and 96 of the /CLKIN 77 and /OUT_MDL 81 signals, in turn, results in the alignment of the respective falling edges 98 and 100 of the XCLK 55 and DQ 59 signals (FIG. 4).

As shown in FIG. 4, by delaying the /DLLCLK signal 83 by a time interval necessary to align the falling edges 98 and 100 of the XCLK 55 and DQ 59 signals, the DLLF signal 103 on DLLF signal line 102, which is initiated by the rising edge 104 of the /DLLCLK signal 83, is delayed, resulting in a delay of the falling edge 100 of the DQ signal 59. With a second phase detector 74 and delay circuit 84, despite timing cycle dependant variations in delay elements affecting the primary clock signal adjustments through DLL delay elements 61, a signal which has been skewed to a 40/60 duty cycle from a 55/45 duty cycle may be corrected back to a 55/45 duty cycle for better performance at high speeds.

Thus, in reference to FIGS. 3 and 4, to align both the rising 68 and 70 and falling 98 and 100 edges of the XCLK 55 and DQ 59 signals and, thus, ensure the tAC specifications are met, two phase detectors 50 and 74 are used to separately initiate portions of the DQ signal 59. According to an embodiment of the invention, a system clock signal is received, processed and compared with a signal representative of the timing of the DQ signal 59. The processed CLKIN signal 53 is delayed by delay elements 61 set by a first phase detector 50. The output of delay elements 61 is further delayed by delay circuit 88 set by a set register circuit 92. The inverse of the delayed system clock signal is also further delayed by delay circuitry 84 set by a second phase detector 74. In this way, both the rising and falling edges of the system clock signal may be aligned with both the rising and falling edges of the local clock signal. By aligning both the rising and falling edges of the system and local clock signals, variations in delays caused by the various DLL delay elements are compensated.

Figure 5:
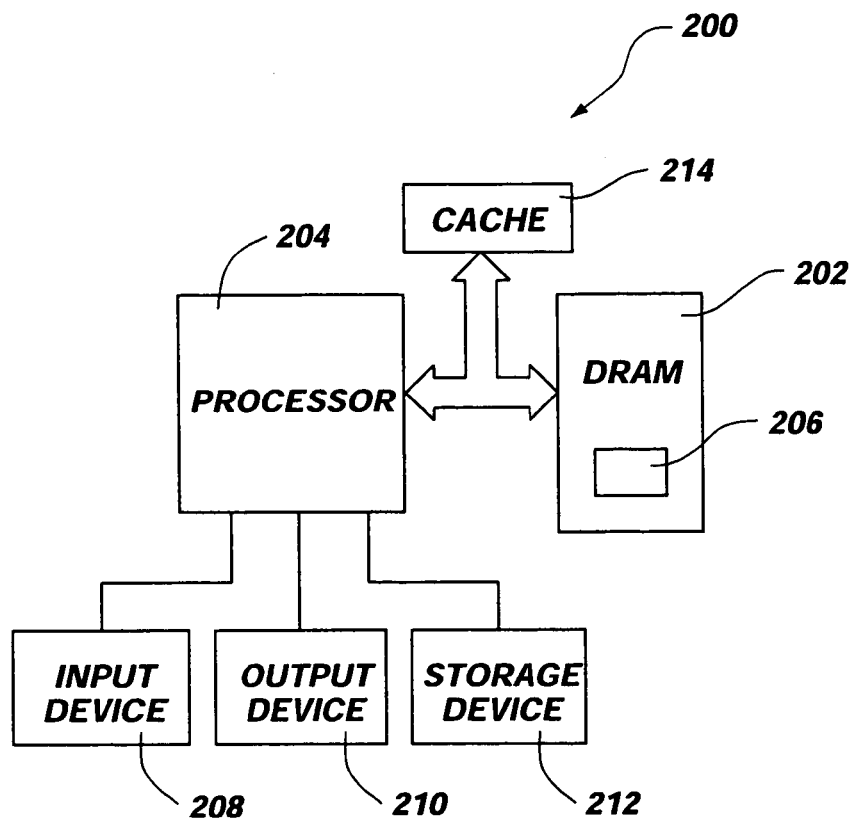
FIG. 5 is a block diagram of an electronic system including a substrate according to the present invention.

FIG. 5 is a block diagram of an electronic system 200 which includes components having one or more substrates 206 comprising circuit traces or other signal lines and components configured according to one or more embodiments of the present invention. The electronic system 200 includes a processor 204 for performing various computing functions, such as executing specific software to perform specific calculations or tasks. Additionally, the electronic system 200 includes one or more input devices 208, such as a keyboard or a mouse, coupled to the processor 204 to allow an operator to interface with the electronic system 200. The electronic system 200 also includes one or more output devices 210 coupled to the processor 204, such output devices 210 including such outputs as a printer, a video terminal or a network connection. One or more data storage devices 212 are also conventionally coupled to the processor 204 to store or retrieve data from external storage media. Examples of conventional storage devices 212 include hard and floppy disks, tape cassettes, and compact disks. The processor 204 is also conventionally coupled to a cache memory 214, which is usually static random access memory (SRAM) and coupled to DRAM 202. It will be understood, however, that the printed circuit board or other substrate 206 configured according to one or more of the embodiments of the present invention may be incorporated into any one of the cache, DRAM, input, output, storage and processor devices 214, 202, 208, 210, 212, and 204.

Figure 6:
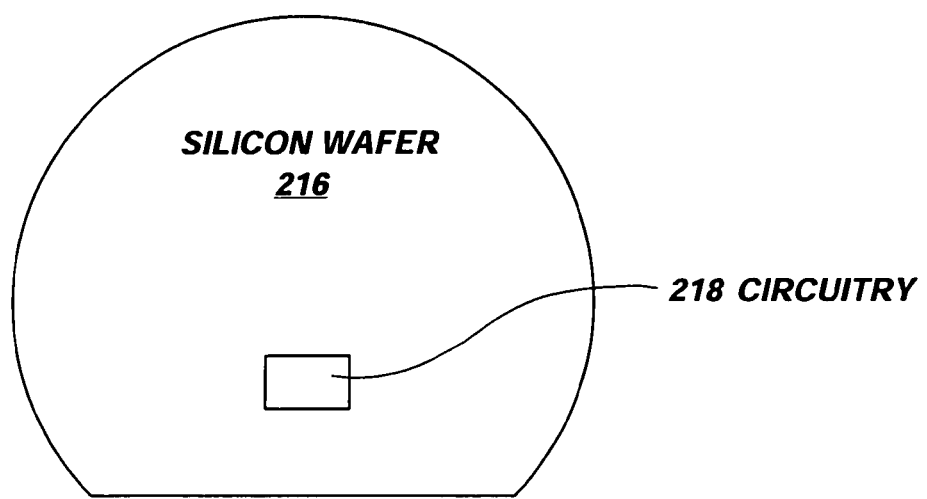
FIG. 6 is a diagram of a semiconductor wafer having circuitry configured according to an embodiment of the present invention.

As shown in FIG. 6, circuitry 218, in accordance with one or more embodiments of the present invention described herein, may be fabricated on the surface of a semiconductor wafer 216 of silicon, gallium arsenide, or indium phosphide. One of ordinary skill in the art will understand how to adapt such designs for a specific chip architecture or semiconductor fabrication process. Of course, it should be understood that the circuitry 218 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

Although the present invention has been shown and described with reference to a particular preferred embodiment, various additions, deletions and modifications that are obvious to a person skilled in the art to which the invention pertains, even if not shown or specifically described herein, are deemed to lie within the scope of the invention as encompassed by the following claims.

What is claimed is:

1. A synchronizing circuit, comprising:
a first phase detector configured to generate at least one first control signal related to a first phase comparison of a first edge, in a first direction, of a clock signal and a first edge, in the first direction, of a modified clock signal;
a first delay circuit configured to use a first delay magnitude related to the at least one first control signal to generate an intermediate clock signal as a delayed version of the clock signal;
a second phase detector configured to generate at least one second control signal related to a second phase comparison of a second edge, in a direction opposite to the first direction, of the clock signal and a second edge, in a direction opposite to the first direction, of the modified clock signal;
a second delay circuit configured to use a second delay magnitude related to the at least one second control signal to generate the second edge of an inverse of the modified clock signal as a delayed version of the second edge of an inverse of the intermediate clock signal; and
a third delay circuit configured to delay the intermediate clock signal by a third delay magnitude, wherein the third delay magnitude corresponds to a value that lies between a value of the first delay magnitude and a value of the second delay magnitude.

2. The synchronizing circuit of claim 1, further comprising at least one output buffer configured to generate a first data output substantially synchronized to the first edge of the modified clock signal and generate a second data output substantially synchronized to the second edge of the inverse of the modified clock signal.

3. The synchronizing circuit of claim 1, wherein the third delay magnitude is substantially equal to the delay of at least one output buffer.

4. An electronic system comprising:
a processor;
a memory device associated with the processor; and
at least one of an input device, an output device and a data storage device associated with the processor; wherein at least one component of the electronic system comprises at least one synchronizing circuit comprising:
a first phase detector configured to generate at least one first control signal responsive to a first phase comparison of a first edge of a clock signal and a first edge of a modified clock signal;
a first delay circuit configured to generate an intermediate clock signal as the clock signal delayed by a first delay magnitude related to the at least one first control signal;
a second phase detector configured to generate at least one second control signal responsive to a second phase comparison of an opposite direction edge of the clock signal and an opposite direction edge of the modified clock signal;
a second delay circuit configured to generate the opposite direction edge of an inverse of the modified clock signal as the opposite direction edge of an inverse of the intermediate clock signal delayed by a second delay magnitude related to the at least one second control signal; and a third delay circuit configured to delay the intermediate clock signal by a third delay magnitude, wherein the third delay magnitude corresponds to a value that lies between a value of the first delay magnitude and a value of the second delay magnitude.

5. The electronic system of claim 4, further comprising at least one output buffer configured to generate a first data output substantially synchronized to the first edge of the modified clock signal and generate a second data output substantially synchronized to the second edge of the inverse of the modified clock signal.

6. The electronic system of claim 4, wherein the third delay magnitude is substantially equal to the delay of at least one output buffer.

7. A semiconductor substrate comprising structures configured to synchronize data to a system clock signal, the structures comprising:

a first phase detector configured to generate at least one first control signal related to a first phase comparison of a first edge of a clock signal and a first edge of a modified clock signal;

a first delay circuit configured to generate an intermediate clock signal as the first edge of the clock signal delayed by a first delay magnitude related to the at least one first control signal;

a second phase detector configured to generate at least one second control signal related to a second phase comparison of a second edge of the clock signal and a second edge of the modified clock signal, wherein the second edge of the clock signal is in an opposite direction from the first edge of the clock signal and the second edge of the modified clock signal is in an opposite direction from the first edge of the clock signal; and a second delay circuit configured to generate the second edge of an inverse of the modified clock signal as the second edge of an inverse of the intermediate clock signal delayed by a second delay magnitude related to the at least one second control signal; and a third delay circuit configured to delay the intermediate clock signal by a third delay magnitude, wherein the third delay magnitude corresponds to a value that lies between a value of the first delay magnitude and a value of the second delay magnitude.

8. The semiconductor substrate of claim 7, further comprising at least one output buffer configured to generate a first data output substantially synchronized to the first edge of the modified clock signal and generate a second data output substantially synchronized to the second edge of the inverse of the modified clock signal.

9. The semiconductor substrate of claim 7, wherein the third delay magnitude is substantially equal to the delay of at least one output buffer.

* * * * *